United States Patent
Umeno (10) Patent No.: US 9,491,844 B2
(45) Date of Patent: Nov. 8, 2016

(54) ELECTRONIC DEVICE

(71) Applicant: DENSO CORPORATION, Kariya, Aichi-pref. (JP)

(72) Inventor: Masafumi Umeno, Okazaki (JP)

(73) Assignee: DENSO CORPORATION, Kariya (JP)

( * ) Notice: Subject to any disclaimer, the term of this patent is extended or adjusted under 35 U.S.C. 154(b) by 28 days.

(21) Appl. No.: 14/690,704

(22) Filed: Apr. 20, 2015

(65) Prior Publication Data

US 2015/0327354 A1 Nov. 12, 2015

(30) Foreign Application Priority Data

May 7, 2014 (JP) .................................. 2014-96209

(51) Int. Cl.
*H05K 7/20* (2006.01)
*H05K 1/02* (2006.01)
*H05K 1/11* (2006.01)
(Continued)

(52) U.S. Cl.
CPC .............. *H05K 1/02* (2013.01); *H05K 1/0204* (2013.01); *H05K 1/11* (2013.01); *H05K 1/115* (2013.01); *H05K 5/0047* (2013.01); *H05K 7/20* (2013.01); *H05K 7/205* (2013.01); *H05K 2201/10545* (2013.01)

(58) Field of Classification Search
CPC .............................. G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ........................ 361/676–678, 679.46–679.54, 361/688–723; 165/80.1–80.5, 104.33, 185; 174/15.1–15.3, 16.1–16.3, 547, 548; 257/712–722, E23.088; 24/453, 24/458–459; 454/184; 312/236
See application file for complete search history.

(56) References Cited

U.S. PATENT DOCUMENTS

| | | | | |
|---|---|---|---|---|
| 5,923,084 A | * | 7/1999 | Inoue | H01L 23/3121 257/712 |
| 7,329,846 B2 | * | 2/2008 | Park | H01L 23/3672 219/622 |
| 2004/0223304 A1 | * | 11/2004 | Kobayashi | B60R 16/0238 361/715 |

(Continued)

FOREIGN PATENT DOCUMENTS

| | | |
|---|---|---|
| JP | H10-084175 A | 3/1998 |
| JP | 2006-108326 A | 4/2006 |
| JP | 2007-059608 A | 3/2007 |

*Primary Examiner* — Anthony Haughton
*Assistant Examiner* — Razmeen Gafur
(74) *Attorney, Agent, or Firm* — Posz Law Group, PLC (57) ABSTRACT

An electronic device includes a circuit board, first and second electronic components, a housing, and a heat conduction member. The first electronic component is mounted on a first surface of the circuit board, and the second electronic component is mounted on a second surface of the circuit board. The first electronic component and the second electronic component are arranged in an arrangement direction. The heat conduction member is disposed between the housing and a first component-opposite portion of the circuit board opposite to the first electronic component, and between the housing and a second component-opposite portion of the circuit board opposite to the second electronic component. The circuit board has a through hole in a formation area between the first electronic component and the second electronic component. The heat conduction member integrally covers each of the first component-opposite portion and the second component-opposite portion and the formation area of the circuit board.

7 Claims, 7 Drawing Sheets (51) Int. Cl.
 *H05K 5/00* (2006.01)
 *H01L 23/473* (2006.01)

(56) References Cited

U.S. PATENT DOCUMENTS

| | | | |
|---|---|---|---|
| 2005/0190539 A1* | 9/2005 | Watanabe | H05K 7/20854 361/704 |
| 2007/0139896 A1* | 6/2007 | Yamada | H01L 23/34 361/720 |
| 2007/0268671 A1* | 11/2007 | Brandenburg | H01L 23/3675 361/704 |
| 2009/0295317 A1* | 12/2009 | Townsend | B25J 9/1612 318/400.4 |
| 2009/0295325 A1* | 12/2009 | Sekine | B62D 5/0406 318/646 |
| 2010/0038758 A1* | 2/2010 | Stolze | H01L 23/367 257/675 |
| 2010/0091464 A1* | 4/2010 | Ohnishi | H01L 23/053 361/723 |
| 2010/0246139 A1* | 9/2010 | Suzuki | H01L 23/3737 361/719 |
| 2011/0013365 A1* | 1/2011 | Oota | B62D 5/0406 361/707 |
| 2011/0044009 A1* | 2/2011 | Fukuda | H01L 21/565 361/720 |
| 2011/0156090 A1* | 6/2011 | Lin | H01L 33/486 257/99 |
| 2011/0268593 A1* | 11/2011 | Yamada | F04B 35/04 417/410.1 |
| 2012/0039039 A1* | 2/2012 | Nishikimi | H05K 7/20927 361/689 |
| 2012/0120610 A1* | 5/2012 | Saitou | H01L 21/565 361/720 |
| 2012/0170217 A1* | 7/2012 | Nishikimi | H05K 7/20927 361/689 |
| 2013/0010426 A1* | 1/2013 | Nakano | H02K 11/33 361/690 |
| 2013/0062751 A1* | 3/2013 | Takagi | H01L 23/3675 257/692 |

\* cited by examiner

ELECTRONIC DEVICE

CROSS REFERENCE TO RELATED APPLICATION

This application is based on Japanese Patent Application No. 2014-96209 filed on May 7, 2014, the disclosure of which is incorporated herein by reference.

TECHNICAL FIELD

The present disclosure relates to an electronic device in which a circuit board having an electronic component thereon is accommodated in a housing, and a heat conduction member is disposed between the circuit board and the housing on a side opposite to the electronic component to dissipate heat of the electronic component to the housing.

BACKGROUND

For example, JP 2007-59608 A discloses an electronic device having a housing, a circuit board, an electronic component, and a heat conduction member. The circuit board is accommodated in the housing. The electronic component is disposed on the circuit board. The heat conduction member is disposed between the housing and a component-opposite portion of the circuit board defined on a side opposite to the electronic component to dissipate heat generated from the electronic component to the housing.

SUMMARY

In a case where a circuit board is deformed during assembling of the circuit board and a housing, a distance between the circuit board and the housing is reduced or increased relative to an expected distance provided when the circuit board is not deformed. The deformation of the circuit board may be different depending on a production lot or the like. Also, the state of the deformation of the circuit board varies in accordance with the temperature of an environment when in use. For example, when the circuit board is used in an environment where the temperature largely changes, for example, in a vehicle, the amount of change of deformation is large.

In a case where the quantity of heat conduction member is small, when the distance between the circuit board and the housing is increased due to the deformation of the circuit board, a contact area with the circuit board and the housing is reduced or the heat conduction member is not in contact with the circuit board or the housing. In such a case, there is a possibility that a thermal resistance increases and a heat dissipation performance cannot be ensured. Therefore, the quantity of the heat conduction member is set to a large quantity considering a margin so that dissipation of heat of the electronic components can be ensured even if the distance between the circuit board and the housing is an estimated maximum distance.

On the other hand, when the distance between the circuit board and the housing is reduced due to the deformation of the circuit board, the heat conduction member flows in a planar direction perpendicular to a thickness direction of the circuit board, and hence the heat conduction member contacts with the circuit board and the housing with an area greater than necessary for ensuring the heat dissipation performance. That is, when the distance is small, the heat conduction member is provided more than necessary. Since the heat conduction member is generally expensive, there is a demand on reducing the quantity of the heat conduction member to be arranged.

It is an object of the present disclosure to provide an electronic device which is capable of ensuring a heat dissipation performance while reducing the quantity of a heat conduction member to be arranged.

According to an aspect of the present disclosure, an electronic device includes a circuit board, a plurality of electronic components, a housing, and a heat conduction member. The circuit board has a first surface and a second surface. The plurality of electronic components includes a first electronic component and a second electronic component. The first electronic component is mounted on the first surface of the circuit board. The second electronic component is mounted on the second surface of the circuit board. The first electronic component and the second electronic component are arranged in an arrangement direction. The housing accommodates the circuit board and the electronic components. The heat conduction member is disposed between a first component-opposite portion of the second surface of the circuit board and a first housing opposed portion of the housing, and between a second component-opposite portion of the first surface of the circuit board and a second housing opposed portion of the housing. The first component-opposite portion is a portion of the second surface of the circuit board opposite to the first electronic component. The first housing opposed portion is a portion of the housing opposed to the first component-opposite portion. The second component-opposite portion is a portion of the first surface opposite to the second electronic component. The second housing opposed portion is a portion of the housing opposed to the second component-opposite portion. The heat conduction member has a flexibility adhering to the first and second component-opposite portions and the first and second housing opposed portions. The circuit board is formed with a through hole in a formation area defined between the first electronic component and the second electronic component. The heat conduction member integrally covers the first component-opposite portion and the formation area of the circuit board on the second surface of the circuit board. The heat conduction member integrally covers the second component-opposite portion and the formation area of the circuit board on the first surface of the circuit board.

In the above structure, when the circuit board is deformed, one of a first arrangement space defined between the first component-opposite portion and the first housing opposed portion and a second arrangement space defined between the second component-opposite portion and the second housing opposed portion is narrowed, and the other of the first arrangement space and the second arrangement space is expanded. As a result, pressure of the heat conduction member increases on a narrowed side, and hence a part of the heat conduction member flows toward an opposite side, that is, an expanded side through the through hole. Therefore, the quantity of the heat conduction member on the narrowed side is reduced, and the quantity of the heat conduction member on the expanded side is increased. In this way, the heat conduction member is lent or borrowed between the adjacent electronic components. Accordingly, the heat dissipation performance can be ensured while reducing the total quantity of the heat conduction member to be arranged.

The pressure of the heat conduction member depends on a resistance receiving from the circuit board (or the housing) when the heat conduction member being compressed between the circuit board and the housing and flowing in a direction along the first surface or the second surface of the circuit board. It is known that the resistance is proportional to a value obtained by dividing a contact area between the circuit board (or the housing) and the heat conduction member by the thickness of the heat conduction member, based on the definition of the viscosity of a substance. Namely, the pressure is proportional to the value of "contact area/thickness".

When there is a pressure difference between a portion of the heat conduction member disposed on the first surface of the circuit board and a portion of the heat conduction member disposed on the second surface of the circuit board due to the deformation of the circuit board, the heat conduction member flows from a high pressure side to a low pressure side through the through hole so as to reduce the pressure difference. When the pressure of the portion of the heat conduction member on the first surface of the circuit board and the pressure of the portion of the heat conduction member on the second surface of the circuit board substantially accord with each other, the value of "contact area/thickness" is substantially equalized between the portion of the heat conduction member on the first surface of the circuit board and the pressure of the portion of the heat conduction member on the second surface of the circuit board. Because thermal resistance is proportional to the value of "thickness/contact area", the thermal resistance is substantially equalized between the portion of the heat conduction member on the first surface of the circuit board and the thermal resistance of the portion of the heat conduction member on the second surface of the circuit board. In this way, the heat conduction member can achieve a self-alignment effect of equalizing the thermal resistance of the heat conduction member between the first electronic component and the second electronic component arranged adjacent to each other.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Hereinafter, embodiments of the present disclosure will be described with reference to the drawings. The same or equivalent components will be designated with the same reference numbers throughout the embodiments.

Figure 1:
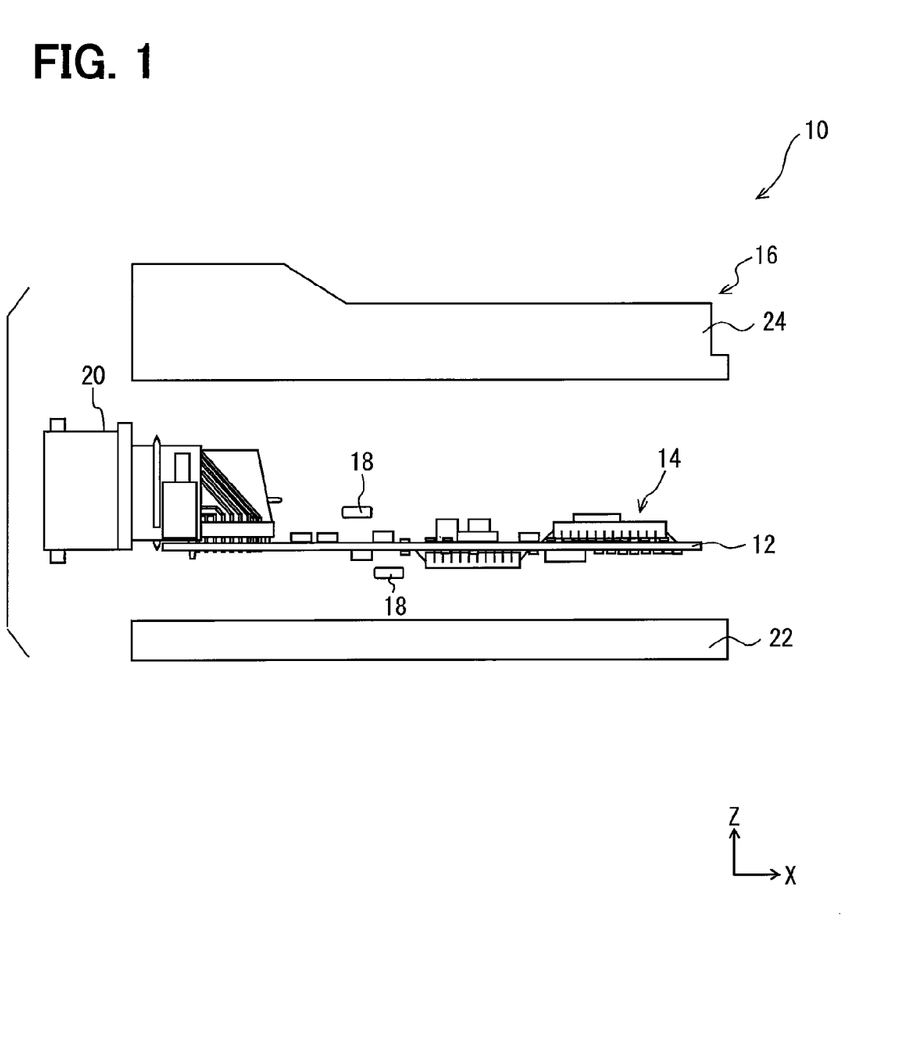
FIG. 1 is an exploded side view of an electronic control unit according to a first embodiment of the present disclosure.

An assembling direction in which a case 22 and a cover 24 are joined to each other will be referred to as a Z-direction, and corresponds to an up and down direction in FIG. 1. A direction perpendicular to the Z-direction and corresponding to an arrangement direction of adjacent electronic components 14a and 14b will be referred to as an X-direction. A direction perpendicular to the Z-direction and the X-direction will be referred to as a Y-direction. Also, a "planar shape" means a shape along a plane including the X-direction and the Y-direction, if there is no notice. A "plan view" means a view when viewed in a direction perpendicular to the plane including the X-direction and the Y-direction, if there is no notice.

First Embodiment

A structure of an electronic control unit according to a first embodiment will be described with reference to FIG. 1. The electronic control unit is, for example, configured as an engine electronic control unit (ECU) for a vehicle. The electronic control unit corresponds to the electronic device.

As shown in FIG. 1, an electronic control unit 10 includes a circuit board 12, electronic components 14, a housing 16, and a heat conduction member 18. The circuit board 12 and the electronic components 14 are accommodated in the housing 16. The heat conduction member 18 is disposed between the circuit board 12 and the housing 16 to release heat generated from the electronic components 14.

The circuit board 12 is a printed board made by arranging wirings in an electrically insulating base material, such as resin or ceramic. The electronic components 14 are mounted on the circuit board 12. The electronic components 14 form a circuit with the wirings.

A connector 20 is mounted on the circuit board 12 to electrically relay the circuit of the circuit board 12 and an external device. The connector 20 has an electrically connecting portion electrically connected to the circuit board 12, and an externally connecting portion to be connected to the external device. The electrically connecting portion is accommodated in the housing 16, and the externally connecting portion is exposed from the housing 16 through an opening (not shown) of the housing 16.

For example, the electronic components 14, which are mounted on the circuit board 12, include a microcomputer, switching elements, such as MOSFETs, a resistor and a capacitor. The electronic components 14 are mounted on a surface 12a and an opposite surface 12b of the circuit board 12. The surface 12a will be also referred to as a first surface 12a and the opposite surface 12b will also be referred to as a second surface 12b.

The housing 16 has a two-separable structure in the Z-direction. In other words, the housing 16 is made of two members, such as a case 22 and a cover 24, coupled in the Z-direction. The case 22 has a box shape with an opening on one side. The cover 24 is coupled to the case 22 to cover the opening of the case 22. For example, the case 22 and the cover 24 are fixed to each other using screws (not shown) or the like.

The housing 16 is made of a metal such as aluminum, or a resin such as a polyphenylene sulfide (PPS). Considering heat dissipation from the electronic components 14, a metal is more advantageous than a resin. In the present embodiment, the housing 16 is an aluminum die-cast housing, for example.

The heat conduction member 18 is disposed between the surface of the circuit board 12 and the housing 16, the surface being opposite to a surface on which the electronic component 14 is mounted. The heat conduction member 18 functions to release heat generated from the electronic component 14 toward the housing 16.

The heat conduction member 18 has a flexibility (softness) to adhere to (closely contact with) both of the circuit board 12 and the housing 16. In other words, the heat conduction member 18 has a viscosity to flow when being applied with an external force. The heat conduction member 18 is in a semi-solid state (gel state) or has a semi-fluidity. As an example of the heat conduction member 18, a heat dissipation gel made of a mixture of zinc oxide and silicone and having an electrical insulation property is employed. The heat dissipation gel will be also referred to as a heat dissipation grease.

Next, a structure associated with the heat conduction member 18 will be described with reference to FIGS. 2 and 3. The housing 16 is not illustrated in FIG. 2 for the sake of convenience.

Figure 3:
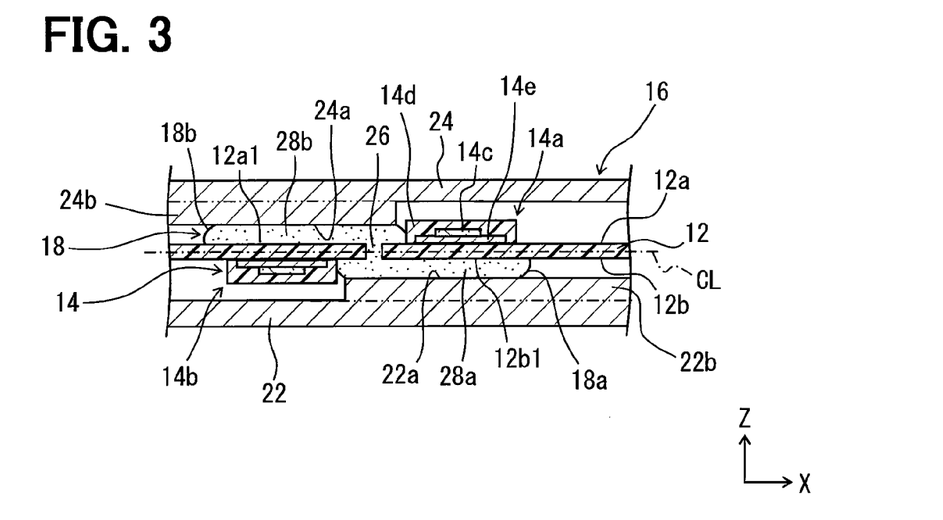
FIG. 3 is a cross-sectional view of the part of the electronic control unit taken along a line III-III in FIG. 2, in a state where a circuit board is not deformed.

FIG. 3 illustrates a state where the circuit board 12 is not deformed. In FIG. 3, a chain line CL indicates a centerline of the circuit board 12 in the Z-direction in the state where the circuit board 12 is not deformed, that is, a reference line (plane) indicating a reference position of the circuit board 12 in the Z-direction.

Figure 2:
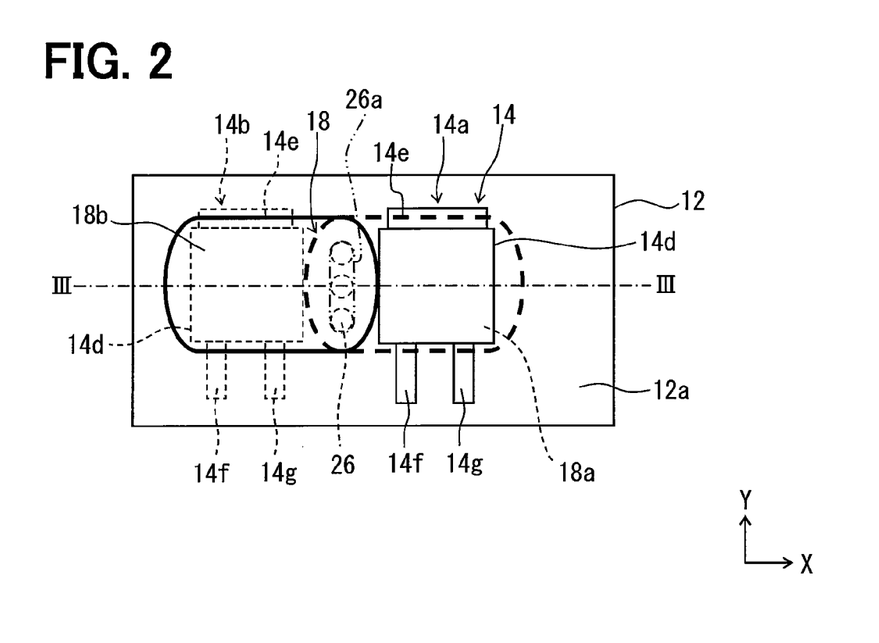
FIG. 2 is an enlarged plan view of a part of the electronic control unit shown in FIG. 1.

As shown in FIGS. 2 and 3, the electronic components 14 include a first component 14a and a second component 14b that are arranged adjacent to each other in the X-direction. The first component 14a and the second component 14b are surface mounted-type heat generating elements having a calorific value greater than that of the other electronic components 14 when being driven by electric conduction. In the present embodiment, for example, the first component 14a and the second component 14b include MOSFETs. The first component 14a is mounted on the first surface 12a of the circuit board 12. The second component 14b is mounted on the second surface 12b of the circuit board 12.

In FIG. 3, a reference number 12b1 indicates a portion of the second surface 12b on an opposite side of the first component 14a mounted on the first surface 12a. That is, the reference number 12b1 indicates the portion of the second surface 12b corresponding to the first component 14a in the Z-direction. Likewise, a reference number 12a1 indicates a portion of the first surface 12a on an opposite side of the second component 14b mounted on the second surface 12b. That is, the reference number 12a1 indicates the portion of the first surface 12a corresponding to the second component 14b in the Z-direction. The portion 12a1 will be also referred to as a second component-opposite portion, and the portion 12b1 will be also referred to as a first component-opposite portion.

The first component 14a and the second component 14b are also referred to as electronic components that are adjacent to each other in an arbitrary direction. The first component 14a and the second component 14b will also be referred to as electronic components 14a and 14b.

The first component 14a includes a semiconductor chip 14c, a sealing resin part 14d, a heat sink 14e, a source terminal 14f, and a gate terminal 14g. The semiconductor chip 14c is provided with the MOSFET. The sealing resin part 14d seals the semiconductor chip 14c. The heat sink 14e serves also as a drain terminal. The semiconductor chip 14c is mounted on the heat sink 14e, and a drain electrode of the MOSFET is electrically connected to the heat sink 14e. A part of the heat sink 14e is exposed from the sealing resin part 14d. In the present embodiment, the heat sink 14e extends from a position right under the semiconductor chip 14c in the Y-direction.

The source terminal 14f is electrically connected to a source electrode of the MOSFET. The gate terminal 14g is electrically connected to the gate electrode. The source terminal 14f and the gate terminal 14g extend in a direction opposite to the heat sink 14e along the Y-direction. For example, the sealing resin part 14d has a rectangular shape in a plan view. The heat sink 14e projects from one side of the sealing resin part 14d in the Y-direction, and the source terminal 14f and the gate terminal 14g project from an opposite side of the sealing resin part 14d in the Y-direction.

In the present embodiment, the second component 14b has the same structure as the first component 14a. The first component 14a and the second component 14b are arranged so that the extending direction of the heat sink 14e relative to the sealing resin part 14d is the same between the first component 14a and the second component 14b. In the first and second components 14a and 14b, each of the heat sink 14e, the source terminal 14f and the gate terminal 14g are made of a metal material, and is soldered to a land formed on the circuit board 12 as a part of the wirings.

The electronic components 14a and 14b dissipate heat generated from the semiconductor chips 14c to the circuit board 12 through the heat sink 14e. A surface of the semiconductor chip 14c opposite to the heat sink 14e is sealed with the sealing resin part 14d. The sealing resin part 14d is, for example, made of an epoxy resin. Therefore, it is more preferable to dissipate heat generated from the semiconductor chip 14c, that is, the heat generated from the electronic components 14a and 14b to the housing 16 through the circuit board 12 and the heat conduction member 18, than dissipate the heat through the sealing resin part 14d.

The circuit board 12 is formed with a through hole 26 at a position between the electronic component 14a and the electronic component 14b, which are arranged in the X-direction. The through hole 26 is disposed on the plane including the X-direction and the Y-direction, and in an opposing area between the electronic component 14a and the electronic component 14b.

In the present embodiment, three through holes 26 are formed, for example. The three through holes 26 are arranged in the Y-direction. The three through holes 26 have a substantially perfect circular shape with the same diameter. In FIG. 2, an area encircled by a chain double-dashed line indicates a formation area 26a where the through hole 26 is formed in the circuit board 12.

The heat conduction member 18 includes a first heat conduction portion 18a and a second heat conduction portion 18b. The first heat conduction portion 18a is for dissipating the heat of the first component 14a toward the case 22. The second heat conduction portion 18b is for dissipating the heat of the second component 14b toward the cover 24. The first heat conduction portion 18a and the second heat conduction portion 18b are made of the same material.

The first heat conduction portion 18a is disposed between the second surface 12b of the circuit board 12 and the case 22. Hereinafter, a space defined between the circuit board 12 and the case 22 opposed to each other and in which the first heat conduction portion 18a is arranged is referred to as a first opposed space (first arrangement space) 28a.

The first heat conduction portion 18a is disposed on the second surface 12b of the circuit board 12 to cover an area including the second component-opposite portion 12b1 and the formation area 26a of the circuit board 12. The first heat conduction portion 18a is disposed to cover a portion 22a of the inner surface of the case 22 opposed to the second component-opposite portion 12b1. The portion 22a will be also referred to as a case opposed portion or a first housing opposed portion. The first heat conduction portion 18a adheres to both of the second surface 12b and the inner surface of the case 22.

The second heat conduction member 18b is disposed between the first surface 12a of the circuit board 12 and the cover 24. Hereinafter, a space defined between the circuit board 12 and the cover 24 opposed to each other and in which the second heat conduction member 18b is arranged is referred to as a second opposed space (second arrangement space) 28b.

The second heat conduction portion 18b is disposed on the first surface 12a of the circuit board 12 to cover an area including the first component-opposite portion 12a1 and the formation area 26a of the circuit board 12. The second heat conduction portion 18b is disposed to cover a portion 24a of the inner surface of the cover 24 opposed to the first component-opposite portion 12a1. The portion 24a will be also referred to as a cover opposed portion 24a or a second housing opposed portion 24a. The second heat conduction portion 18b adheres to both of the first surface 12a and the inner surface of the cover 24.

In the present embodiment, in the state where the circuit board 12 is not deformed, a dimension of the first opposed space 28a in the Z-direction and a dimension of the second opposed space 28b in the Z-direction are substantially equal to each other. Further, the quantity (volume) of the first heat conduction portion 18a on the second surface 12b of the circuit board 12 and the quantity (volume) of the second heat conduction portion 18b on the first surface 12a of the circuit board 12 are substantially equal to each other.

The first heat conduction portion 18a is in contact with the second component 14b in the X-direction. The second component 14b, which is adjacent to the first component 14a, serves as a wall or a barrier to restrict the first heat conduction portion 18a from flowing in the X-direction (e.g., in a leftward direction in FIG. 3). Likewise, the second heat conduction portion 18b is in contact with the first component 14a in the X-direction. The first component 14a, which is adjacent to the second component 14b, serves as a wall or a barrier to restrict the second heat conduction portion 18b from flowing in the X-direction (e.g., in a rightward direction in FIG. 3).

Further, the heat conduction member 18 is also located within the through holes 26 of the circuit board 12. The first heat conduction portion 18a and the second heat conduction portion 18b are integrally connected to each other through the portion of the heat conduction member 18 located within the through holes 26.

When the circuit board 12 on which the electronic components 14 are mounted is placed in the housing 16, that is, when the case 22 and the cover 24 are assembled to each other, the first heat conduction portion 18a is interposed between the circuit board 12 and the case 22, and pressure of the first heat conduction portion 18a increases. As a result, a portion of the first heat conduction portion 18a flows into the through holes 26. Likewise, when the case 22 and the cover 24 are assembled to each other, the second heat conduction portion 18b is interposed between the circuit board 12 and the cover 24, and pressure of the second heat conduction portion 18b increases. As a result, a portion of the second heat conduction portion 18b flows into the through holes 26. In the assembling, since the first and second heat conduction portions 18a and 18b partly flow into the through holes 26, the first heat conduction portion 18a and the second heat conduction portion 18b connect to each other.

FIG. 3 shows an example where the first heat conduction portion 18a is in contact with the second component 14b, the second heat conduction portion 18b is in contact with the first component 14a, and the first heat conduction portion 18a and the second heat conduction portion 18b are connected to each other. However, it is not always necessary that the first heat conduction portion 18a and the second heat conduction portion 18b are in the state described above. In the state where the circuit board 12 is not deformed, the first heat conduction portion 18a may not be in contact with the second component 14b. Likewise, the second heat conduction portion 18b may not be in contact with the first component 14a. Further, the first heat conduction portion 18a and the second heat conduction portion 18b may not be connected to each other. In other words, a gap may remain between the first heat conduction portion 18a and the second heat conduction portion 18b within the through holes 26.

As shown in FIG. 3, the case 22 has a protruded portion 22b that protrudes toward the circuit board 12 on the inner wall. The case opposed portion 22a is provided by a portion of an end surface of the protruded portion 22b. Likewise, the cover 24 has a protruded portion 24b that protrudes toward the circuit board 12 on the inner wall. The cover opposed portion 24a is provided by a portion of an end surface of the protruded portion 24b.

Figure 4:
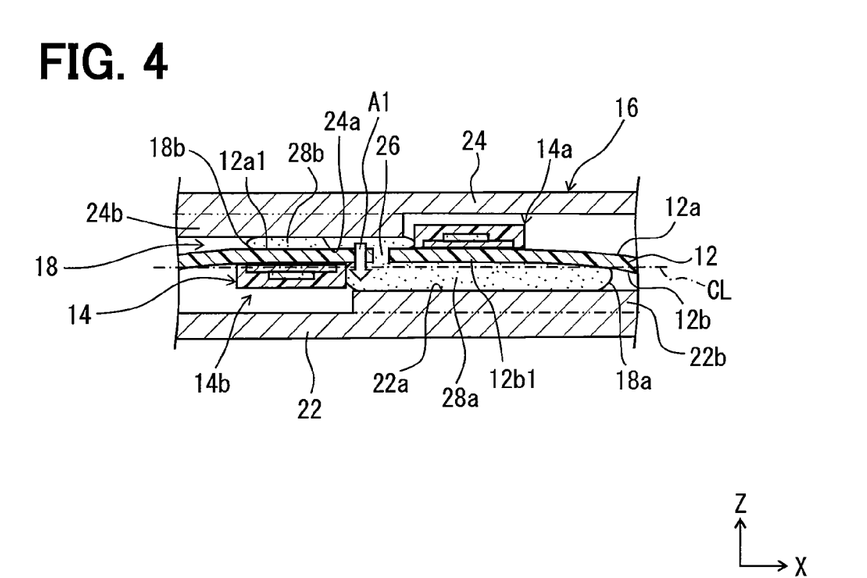
FIG. 4 is a cross-sectional view of the part of the electronic control unit in a state where the circuit board is deformed.

Next, a state where the circuit board 12 is deformed will be described with reference to FIG. 4. Also in FIG. 4, a chain line CL is a reference line (plane) indicating a reference position of the circuit board 12 in the Z-direction. In FIG. 4, the circuit board 12 is deformed relative to the reference line CL. In FIG. 4, it is assumed that the circuit board 12 is subjected to the change in temperature in usage environment, and is deformed from a non-deformed state shown in FIG. 3.

In the example of FIG. 4, the circuit board 12 is deformed convex toward the cover 24. Due to this deformation, the dimension of the first opposed space 28a in the Z-direction is greater than that of the non-deformed state. On the other hand, the dimension of the second opposed space 28b in the Z-direction is smaller than that of the non-deformed state. That is, the second opposed space 28b is narrower than the first opposed space 28a, in the Z-direction.

When the second opposed space 28b is narrowed due to the deformation of the circuit board 12, the pressure of the second heat conduction portion 18b rises in the heat conduction member 18. On the contrary, the first opposed space 28a is expanded, and the pressure of the first heat conduction portion 18a reduces. As a result, the second heat conduction portion 18b flows so as to reduce the pressure. In this case, the portion of the second heat conduction portion 18b flows into the first opposed space 28a through the through holes 26 as shown by an arrow A1 in FIG. 4. When the pressure of the second heat conduction portion 18b substantially matches with the pressure of the first heat conduction portion 18a, the flow of the portion of the second heat conduction portion 18b stops. Therefore, in the deformed state shown in FIG. 4, the first heat conduction portion 18a is thicker than the second heat conduction portion 18b.

When the circuit board 12 is deformed convex toward the case 22, a portion of the first heat conduction portion 18a flows into the second opposed space 28b through the through holes 26. Therefore, the second heat conduction portion 18b becomes thicker than the first heat conduction portion 18a.

Next, advantageous effects of the electronic control unit 10 of the present embodiment will be described.

In the present embodiment, when the circuit board 12 is deformed, one of the first opposed space 28a and the second opposed space 28b is narrowed, and the other of the first opposed space 28a and the second opposed space 28b is expanded. For example, when the second opposed space 28b is narrowed, the second heat conduction portion 18b is compressed between the circuit board 12 and the cover 24, and the pressure of the second heat conduction portion 18b is increased. On the other hand, the first opposed space 28a is expanded. Therefore, a compression force applied to the first heat conduction portion 18a by the circuit board 12 and the case 22 is reduced, and the pressure of the first heat conduction portion 18a is reduced. As a result, a portion of the second heat conduction portion 18b flows into the first opposed space 28a through the through holes 26.

As a result, the quantity of the second heat conduction portion 18b on the narrowed side is reduced, and the quantity of the first heat conduction portion 18a on the expanded side is increased. As such, it is less likely that the heat conduction member 18 (e.g., the second heat conduction portion 18b) will exist on the narrowed side with the quantity more than necessary. Also, it is less likely that the heat conduction member 18 (e.g., the first heat conduction portion 18a) will be insufficient on the expanded side. Further, it is less likely that the first heat conduction portion 18a will not contact with the case 22. Accordingly, a heat dissipation performance is ensured. In this way, since the heat conduction member 18 can be lent and borrowed between the adjacent electronic components 14a and 14b, that is, the heat conduction member 18 is effectively shared between the adjacent electronic components 14a and 14b, the heat dissipation performance can be ensured while reducing the total quantity of the heat conduction member 18 to be used.

The circuit board 12 has the through holes 26 between the mounting portion of the first component 14a and the mounting portion of the second component 14b in the X-direction. The first component 14a restricts the flow of the second heat conduction portion 18b for the second component 14b in the X-direction. Specifically, the first component 14a serves as the barrier, and the second heat conduction portion 18b easily stagnates around the through holes 26. Likewise, the second component 14b restricts the flow of the first heat conduction portion 18a for the first component 14a in the X-direction. Specifically, the second component 14b serves as the barrier, and the first heat conduction portion 18a easily stagnates around the through holes 26. Therefore, the flow of the heat conduction member 18 into the through holes 26 is facilitated.

The pressure of the heat conduction member 18 depends on a resistance receiving from the circuit board 12 (or the housing 16) when the heat conduction member 18 being compressed between the circuit board 12 and the housing 16 and flowing in directions perpendicular to the Z-direction. It is known that the resistance is proportional to a value obtained by dividing a contact area between the circuit board 12 (or the housing 16) and the heat conduction member 18 by the thickness of the heat conduction member 18, based on the definition of the viscosity of a substance. Namely, the pressure is proportional to the value of "contact area/thickness".

In the present embodiment, when there is a pressure difference between the second heat conduction portion 18b located on the first surface 12a of the circuit board 12 and the first heat conduction portion 18a located on the second surface 12b of the circuit board 12 due to the deformation of the circuit board 12, the heat conduction member 18 flows from a high pressure side to a low pressure side through the through hole 26 so as to reduce the pressure difference. The flow of the heat conduction member 18 stops when the pressure of the first heat conduction portion 18a and the pressure of the second heat conduction portion 18b substantially accord with each other. Further, the value of "contact area/thickness" of the first heat conduction portion 18a and the value of "contact area/thickness" of the second heat conduction portion 18b are substantially equalized with each other. Because thermal resistance is proportional to the value of "thickness/contact area", the thermal resistance of the first heat conduction portion 18a and the thermal resistance of the second heat conduction portion 18b are substantially equalized with each other.

As described above, the heat conduction member 18 can achieve a self-alignment effect of equalizing the thermal resistance of the heat conduction member 18 between the electronic components 14a and 14b arranged adjacent to each other. Therefore, even if the circuit board 12 is deformed, unevenness of the heat dissipation between the adjacent electronic components 14a and 14b can be reduced. For example, unevenness of the life between the electronic components 14a and 14b can be reduced. Also, temperature characteristics can be made even between the electronic components 14a and 14b.

In the embodiment described above, the plural numbers (e.g., three) of the through holes 26 are formed in the formation area 26a of the circuit board 12, for example. However, the number of the through holes 26 is not limited to the example described above. Also, the shape of the through holes 26 is not limited to the substantially perfect circle in the plan view, as in the example described above.

Figure 5:
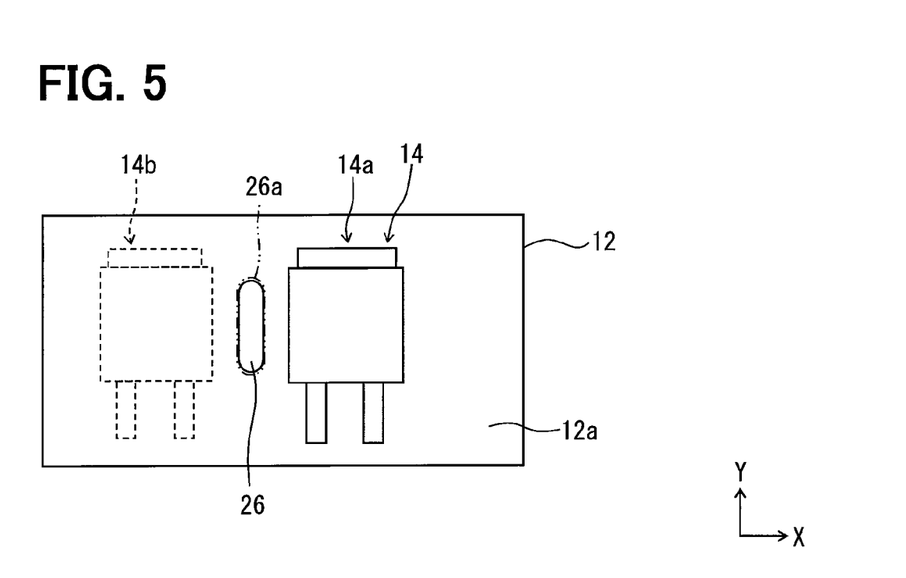
FIG. 5 is a plan view of the part of the electronic control unit for illustrating a first modification.

As a first modification shown in FIG. 5, a single through hole 26 may be employed. In this example, the through hole 26 has an elongated shape in the Y-direction. In other words, in the plan view, a dimension of the through hole 26 in the Y-direction is greater than a dimension of the through hole 26 in the X-direction. The size of the through hole 26 is substantially equal to the formation area 26a. In FIG. 5, the heat conduction member 18 is not illustrated for the sake of convenience. Namely, in the plan view, the through hole 26 has a longitudinal direction in the Y-direction perpendicular to the arrangement direction of the electronic components 14a and 14b.

In this case, a total opening area of the through hole 26 is greater than that when the plural through holes 26 are formed in the formation area 26a. Accordingly, the flow of the heat conduction member 18 from one of the first opposed space 28a and the second opposed space 28b to the other through the through hole 26 can be facilitated.

Second Embodiment

A second embodiment of the present disclosure will be described with reference to FIGS. 6 and 7.

Figure 6:
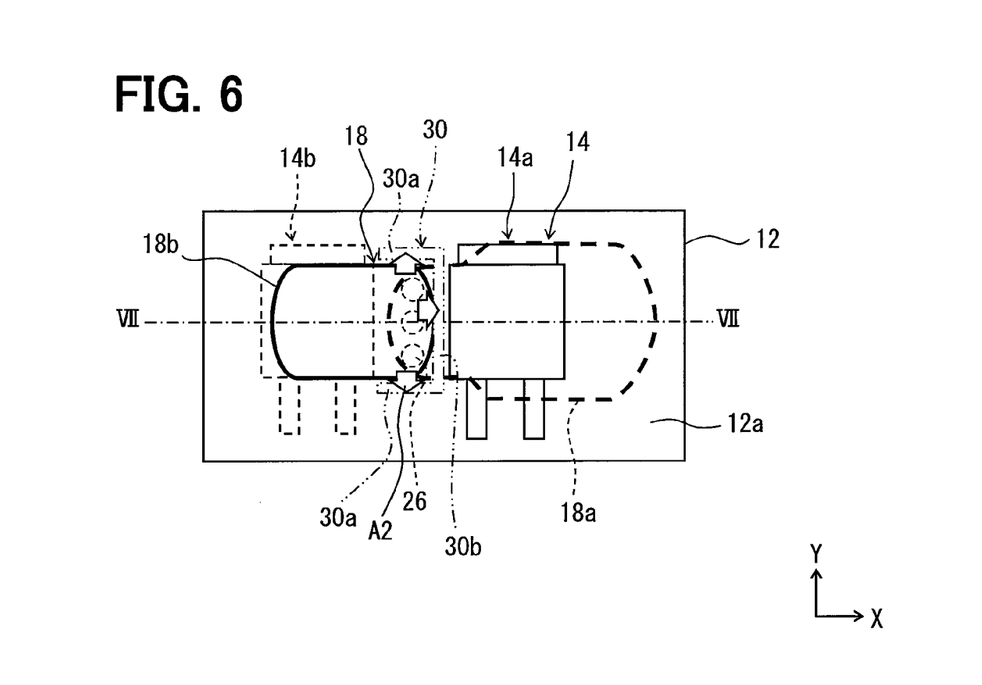
FIG. 6 is a plan view of a part of an electronic control unit according to a second embodiment of the present disclosure.
Figure 7:
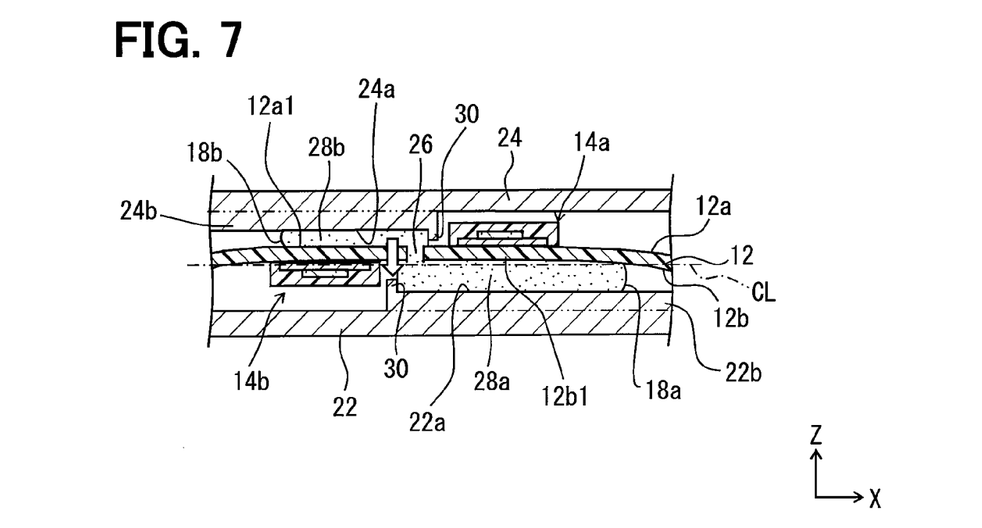
FIG. 7 is a cross-sectional view of the part of the electronic control unit taken along a line VII-VII in FIG. 6.

As shown in FIGS. 6 and 7, the housing 16 has projection walls 30 projecting toward the circuit board 12 on a periphery of the heat conduction member 18 to restrict the flows of the heat conduction member 18 in directions perpendicular to the Z-direction. FIG. 6 is a plan view corresponding to FIG. 2. In FIG. 6, the position of the projection wall 30 of the cover 24 is illustrated with a chain double-dashed line for the sake of convenience. FIG. 7 illustrates a cross sectional view of the electronic control unit 10 in a state where the circuit board 12 is deformed to be convex toward the cover 24.

Each of the case 22 and the cover 24 has the projection wall 30. The projection wall 30 includes a pair of wall-opposed portions 30a and a wall-connecting portion 30b connecting ends of the wall-opposed portions 30a on one side. The wall-opposed portions 30a extend in the X-direction, and are apart from each other in the Y-direction. The wall-connecting portion 30b extends in the Y-direction and bridges over the opposed region between the first component 14a and the second component 14b. In other words, the projection wall 30 has a substantially right-angled U-shape in the plan view.

Each of the wall-opposed portions 30a has a length that does not overlap with the electronic components 14a and 14b in the X-direction. In the plane including the Y-direction and the X-direction, the projection wall 30 is located on a periphery of the through holes 26.

A dimension of the projection wall 30 in the Z-direction, that is, a projection height of the projection wall 30 is set to a dimension so that the projection wall 30 does not contact with the circuit board 12 even when the distance between the projection wall 30 and the circuit board 12 is reduced due to the deformation of the circuit board 12.

Next, advantageous effects of the electronic control unit 10 according to the present embodiment will be described.

As described above, the housing 16 has the projection wall 30 on the periphery of the heat conduction member 18. Even when the second opposed space 28b is reduced and the pressure of the second heat conduction portion 18b is increased due to the deformation of the circuit board 12, the flows of the second heat conduction portion 18b in directions perpendicular to the Z-direction can be blocked by the projection wall 30 of the cover 24, as shown by arrows A2 in FIG. 6.

Therefore, the flow of the second heat conduction portion 18b into the through hole 26 is facilitated. That is, the transfer of the heat conduction member 18 between the first opposed space 28a and the second opposed space 28b is facilitated. Even when the pressure of the first heat conduction portion 18a is increased due to the deformation of the circuit board 12, the similar effect can be achieved by the projection wall 30 of the case 22.

The projection wall 30 is disposed on the periphery of the through holes 26. Therefore, the heat conduction member 18 easily stagnates around the through holes 26. As a result, the flow of the heat conduction member 18 into the through holes 26 is facilitated.

The projection wall 30 has the pair of wall-opposed portions 30a extending in the X-direction, and the wall-connecting portion 30b connecting between the wall-opposed portions 30a. Therefore, as shown by the arrows A2 in FIG. 6, the flows of the heat conduction member 18 in the X-direction and in the Y-direction can be restricted by the projection wall 30. As such, the flow of the heat conduction member 18 into the through holes 26 is further facilitated.

For example, each of the projection walls 30 has the projection height so that the projection wall 30 does not contact the circuit board 12 even when the circuit board 12 is deformed. Alternatively, the projection walls 30 may have a projection height so that the projection walls 30 contact with the circuit board 12. For example, the projection height of the projection walls 30 may be set to the height so that the projection walls 30 do not contact with the circuit board 12 when the circuit board 12 is not deformed, and only the projection wall 30 that is adjacent to the side to which the circuit board 12 is convex contacts with the circuit board 12. In this case, the flow of the heat conduction member 18 is effectively restricted on the side in which the pressure of the heat conduction member 18 increases.

In the example described above, the projection wall 30 is provided between the first heat conduction portion 18a and the second component 14b. Also, the projection wall 30 is provided between the second heat conduction portion 18b and the first component 14a. The positions of the projection walls 30 are not limited to the example described above as long as the projection walls 30 are disposed on a peripheral area of the heat conduction member 18.

Figure 8:
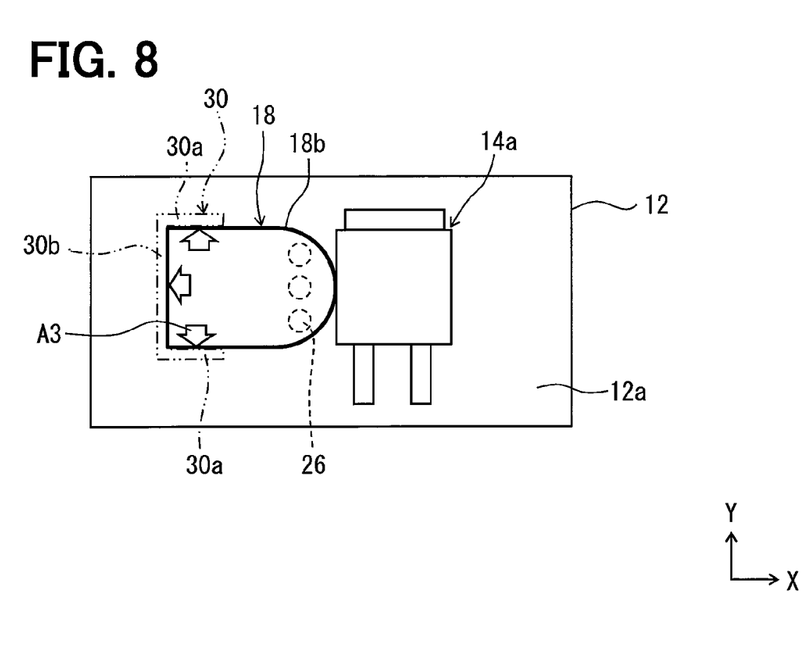
FIG. 8 is a plan view of the part of the electronic control unit for illustrating a second modification.

For example, as in a second modification shown in FIG. 8, the projection wall 30 may be disposed in a peripheral area of the second heat conduction portion 18b on a side opposite to the first component 14a in the X-direction. Also in this case, the projection wall 30 has the pair of wall-opposed portions 30a and the wall-connecting portion 30b, similar to the example described above. The first component 14a restricts the flow of the second heat conduction portion 18b in the X-direction.

In this case, therefore, the wall-connecting portion 30b and the first component 14a are located on opposite sides of the second heat conduction portion 18b in the X-direction, and the wall-opposed portions 30a are disposed on opposite sides of the second heat conduction portion 18b in the Y-direction. Since the second heat conduction portion 18b is surrounded by the projection wall 30 and the first component 14a, the flows of the second heat conduction portion 18b in directions perpendicular to the Z-direction is effectively restricted, as shown by arrows A3 in FIG. 8. As a result, the flow of the second heat conduction portion 18b into the through hole 26 is facilitated. This is true for the first heat conduction portion 18a.

FIG. 8 substantially corresponds to the view of FIG. 2, but the illustration of the second component 14b and the first heat conduction portion 18a are omitted for the sake of convenience.

The structure of the projection wall 30 is not limited to the structure described above. The projection wall 30 may have any structure. For example, one of the pair of wall-opposed portions 30a may be eliminated. As another example, the projection wall 30 may have only the wall-connecting portion 30b. As further another example, the projection wall 30 may have a ring shape surrounding the second heat conduction portion 18b. The shape of the projection wall in the plan view for restricting the flowing of the heat conduction member 18 in the X-direction and the Y-direction is not limited to the shape described above. For example, the projection wall 30 may have a substantially U shape, a substantially C shape, a substantially L shape, or the like in the plan view.

Figure 9:
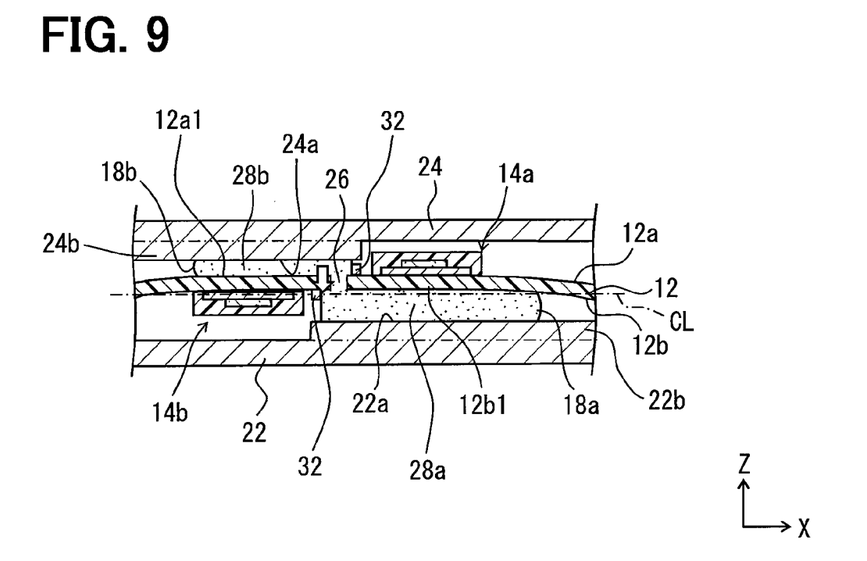
FIG. 9 is a cross-sectional view of the part of the electronic control unit for illustrating a third modification.

As in a third modification shown in FIG. 9, the circuit board 12 may have projection walls 32. In FIG. 9, the projection walls 32 are made of a metal material, and are soldered to the circuit board 12. The projection walls 32 have the similar structure to the projection walls 30 described above. The projection walls 32 disposed on the circuit board 12 can restrict the flow of the heat conduction member 18 in a similar manner to the projection walls 30. The electronic control unit 10 may have both of the projection wall 30 and the projection wall 32.

Third Embodiment

Figure 10:
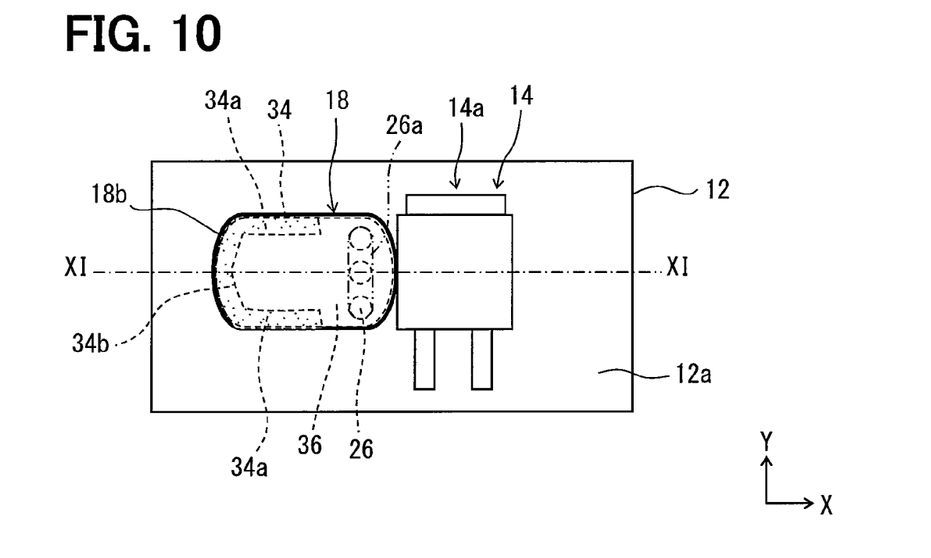
FIG. 10 is a plan view of a part of an electronic control unit according to a third embodiment of the present disclosure.
Figure 11:
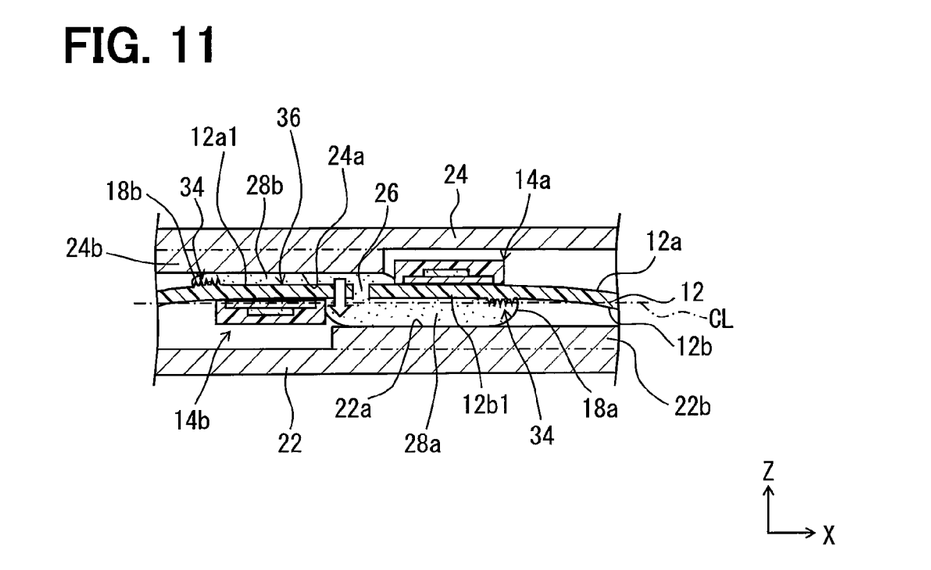
FIG. 11 is a cross-sectional view of the part of the electronic control unit taken along a line XI-XI in FIG. 10.

A third embodiment of the present disclosure will be described with reference to FIGS. 10 and 11.

In the present embodiment, each of the first surface 12a and the second surface 12b of the circuit board 12 has an arrangement area on which the heat conduction member 18 is arranged. The arrangement area of each of the first surface 12a and the second surface 12b has a first surface area 34 and a second surface area 36. The first surface area 34 is defined at least at a part other than the periphery of the through holes 26 in the arrangement area. The second surface area 36 is defined in an area other than the first surface area 34 in the arrangement area.

In the arrangement area, only the first surface area 34 is subjected to a roughening treatment, so that a surface roughness of the first surface area 34 is greater than a surface roughness of the second surface area 36. In this case, the surface roughness is an average surface roughness Ra.

On the first surface 12a of the circuit board 12, the first surface area 34 is defined at an end of the arrangement area of the second heat conduction portion 18b opposite to the first component 14a in the X-direction. Specifically, the first surface area 34 has a pair of rough-surface opposed portions 34a and a rough-surface connecting portion 34b that connects ends of the rough-surface opposed portions 34a on one side. The rough-surface opposed portions 34a extend in the X-direction, and are apart from each other in the Y-direction. The first surface area 34 has a substantially U shape in a plan view. The second heat conduction portion 18b is disposed on the first surface area 34 and the second surface area 36 and has a profile substantially same as a U-shaped outer profile of the first surface area 34. This is true for the second surface 12b.

Next, advantageous effects of the electronic control unit 10 of the present embodiment will be described.

As described above, the circuit board 12 has the roughened first surface area 34 in the arrangement area of the heat conduction member 18. Therefore, resistance that the heat conduction member 18 receives from the circuit board 12 when the heat conduction member 18 flows is increased at the first surface area 34. Therefore, even when the pressure of the second heat conduction portion 18b is increased due to the circuit board 12 being deformed and the second opposed space 28b being narrowed, the flows of the second heat conduction portion 18b in directions perpendicular to the Z-direction can be restricted by the first surface area 34.

As the flow of the second heat conduction portion 18b beyond the first surface area 34 is restricted by the first surface area 34, the flow of the second heat conduction portion 18b into the through holes 26 is facilitated. That is, the transfer of the heat conduction member 18 can be facilitated between the first opposed space 28a and the second opposed space 28b. Also in a case where the pressure of the first heat conduction portion 18a is increased due to the deformation of the circuit board 12, the similar effects can be achieved by the first surface area 34 on the second surface 12b.

If the first surface area 34 is provided on the periphery of the through holes 26, since the resistance is increased at the first surface area 34, the flow of the heat conduction member 18 into the through hole 26 will be disturbed. In the present embodiment, on the other hand, the first surface area 34 is provided at the position away from the through holes 26. The flow of the second heat conduction portion 18b into the through holes 26 is facilitated while the flow of the second heat conduction portion 18b in directions perpendicular to the Z-direction is restricted.

The first surface area 34 has the pair of rough-surface opposed portions 34a extending in the X-direction, and the connecting portion 34b connecting the rough-surface opposed portions 34a. Therefore, the flows of the heat conduction member 18 in the X-direction and the Y-direction can be restricted by the first surface area 34. As a result, the flow of the heat conduction member 18 into the through holes 26 is further facilitated.

The planar shape of the first surface area 34, which restricts the flows of the heat conduction member 18 in the X-direction and in the Y-direction, is not limited to the substantially U shape. For example, one of the rough-surface opposed portions 34a may be eliminated. As another example, the first surface area 34 may have only the connecting portion 34b.

The planar shape of the first surface area 34 is not limited to the shape described above. The first surface area 34 may have other shapes in the plan view, such as a substantially C shape, a substantially L shape, a substantially right-angled U shape, or the like.

Figure 12:
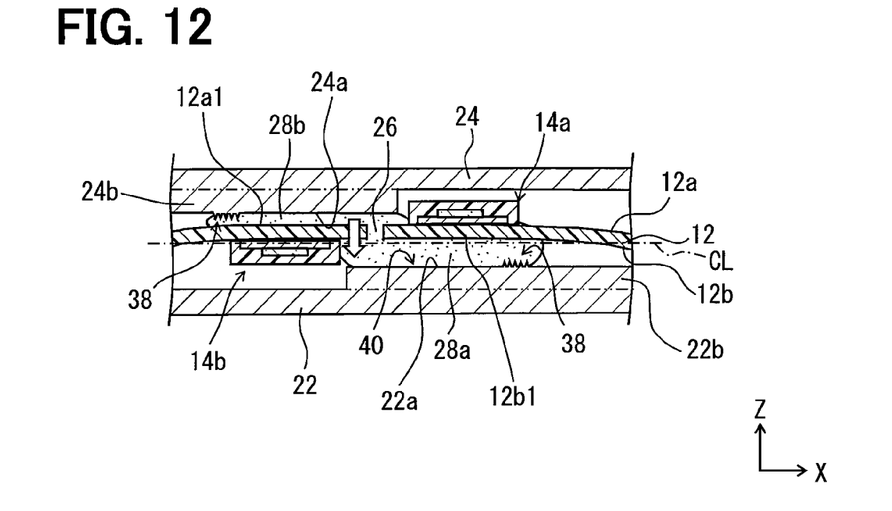
FIG. 12 is a cross-sectional view of the part of the electronic control unit for illustrating a fourth modification.

As in a fourth modification shown in FIG. 12, the housing 16 may have a third surface area 38, which corresponds to the first surface area 34 of the circuit board 12. The case 22 has an arrangement area on which the heat conduction member 18 is arranged on the inner surface. The arrangement area includes the third surface area 38 and a fourth surface area 40. The third surface area 38 is defined in at least a part of the arrangement area of the heat conduction member 18 other than positions corresponding to the through holes 26 and the peripheral area of the through holes 26 in the Z-direction. The fourth surface area 40 is defined at a part other than the third surface area 38 in the arrangement area of the heat conduction member 18.

In the arrangement area, only the third surface area 38 is subjected to the roughening treatment. The surface roughness of the third surface area 38 is greater than the surface roughness of the fourth surface area 40. The position corresponding to the through holes 26 means a position overlapping with the through holes 26 in the plane including the X-direction and the Y-direction. The position corresponding to the peripheral area of the through holes 26 means a position overlapping with the peripheral area of the through holes 26 in the plane including the X-direction and the Y-direction. The cover 24 also has the similar structure to the case 22. As described above, the flow of the heat conduction member 18 can be restricted by the third surface area 38 provided in the housing 16. In the electronic control unit 10, both of the first surface area 34 and the third surface area 38 may be employed.

The embodiments of the present disclosure are described hereinabove. However, the present disclosure is not limited to the embodiments described hereinabove, but may be modified in various other ways without departing from the gist of the present disclosure.

In the embodiments described hereinabove, it is described about the case where the circuit board 12 is deformed due to the temperature change of the environment when in use after the housing 16 is assembled and the electronic control unit 10 (e.g., the engine ECU) is mounted on the vehicle. Even if the circuit board 12 is deformed during the manufacturing and the pressure difference is generated during the assembling of the housing 16, the heat conduction member 18 can be moved from the high pressure side to the low pressure side through the through hole 26.

In the embodiments described hereinabove, the electronic control unit 10 is, for example, the engine ECU. However, the electronic control unit 10 is not limited to the engine ECU. Further, the electronic device is not limited to the electronic control unit 10. The electronic device may be any device as long as it includes the circuit board 12, the electronic components 14, the housing 16 and the heat conduction member 18.

In the embodiments described above, the adjacent electronic components 14a and 14b are arranged in the X-direction. However, the arrangement direction of the adjacent electronic components 14a and 14b is not limited to the X-direction, but may be the Y-direction. Further, the arrangement direction of the adjacent electronic components is not limited to a single direction.

Figure 13:
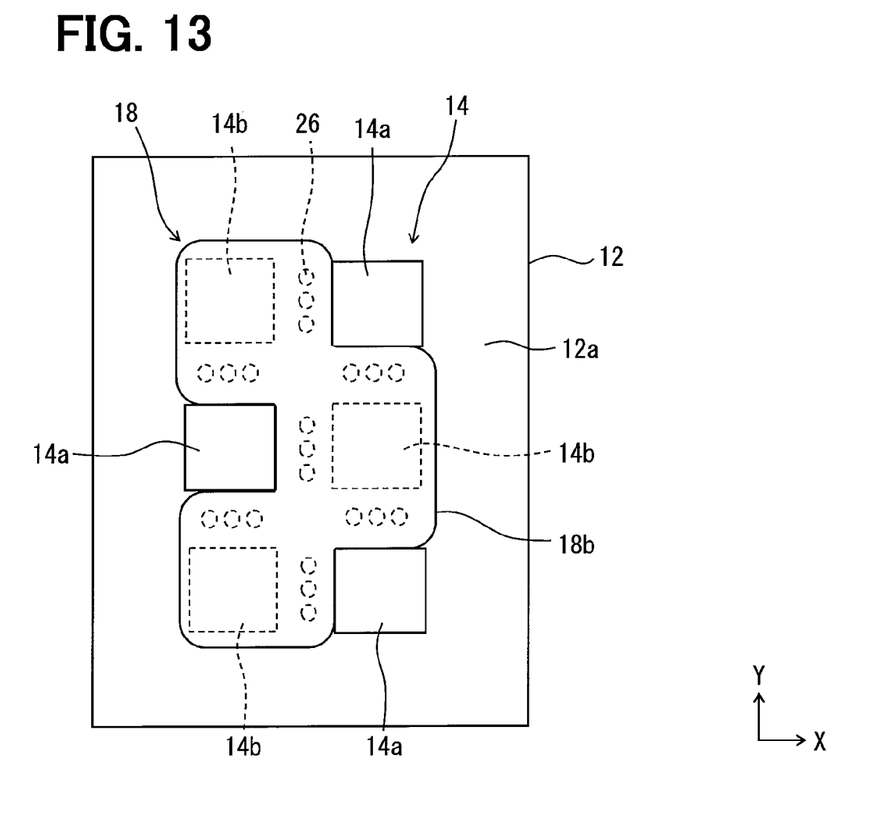
FIG. 13 is a plan view of the part of the electronic control unit for illustrating a fifth modification.

In a fifth modification shown in FIG. 13, six electronic components 14, which have the same structure, are arranged in two lines each having three components (i.e., two lines and three rows), at a predetermined pitch. In FIG. 13, for example, the first component 14a on a second row (e.g., middle component 14a on a left line in FIG. 13) is adjacent to one second component 14b in the X-direction, and is adjacent to two second components 14b in the Y-direction.

The through holes 26 are formed in an area between the first component 14a and the second components 14b. The second heat conduction portion 18b is integrally provided for the three second components 14b. Although not illustrated, on the second surface 12b of the circuit board 12, the first heat conduction portion 18a is integrally provided for three first components 14a, similarly to the second heat conduction portion 18b. In this case, the unevenness of heat dissipation is reduced even for a large number of the electronic components 14a and 14b.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. An electronic device comprising:
a circuit board having a first surface and a second surface opposite to the first surface;
a plurality of electronic components including a first electronic component and a second electronic component, the first electronic component being mounted on the first surface of the circuit board, the second electronic component being mounted on the second surface of the circuit board, the first electronic component and the second electronic component being arranged adjacent to each other in an arrangement direction;
a housing accommodating the circuit board and the plurality of electronic components; and
a heat conduction member being disposed between a first component-opposite portion of the second surface of the circuit board and a first housing opposed portion of the housing and between a second component-opposite portion of the first surface of the circuit board and a second housing opposed portion of the housing, the first component-opposite portion being a portion of the second surface of the circuit board opposite to the first electronic component, the first housing opposed portion being a portion of the housing opposed to the first component-opposite portion, the second component-opposite portion being a portion of the first surface of the circuit board opposite to the second electronic component, the second housing opposed portion is a portion of the housing opposed to the second component-opposite portion, the heat conduction member having a flexibility adhering to the first and second component-opposite portions and the first and second housing opposed portions, wherein
the circuit board is formed with a through hole in a formation area defined between the first electronic component and the second electronic component,
the heat conduction member integrally covers the first component-opposite portion and the formation area on the second surface of the circuit board, and
the heat conduction member integrally covers the second component-opposite portion and the formation area on the first surface of the circuit board.

2. The electronic device according to claim 1, wherein
at least one of the housing and the circuit board includes a projection wall projecting toward the other of the housing and the circuit board on a periphery of the heat conduction member.

3. The electronic device according to claim 2, wherein
the projection wall includes a first wall portion extending in the arrangement direction of the first and second electronic components and a second wall portion extending in a direction perpendicular to the arrangement direction of the first and second electronic components.

4. The electronic device according to claim 3, wherein
the first wall portion and the second wall portion of the projection wall surrounds the heat conduction member with a corresponding one of the second electronic component and the second electronic component on each side of the circuit board.

5. The electronic device according to claim 1, wherein
each of the first surface and the second surface of the circuit board has an arrangement surface area corresponding to an area where the heat conduction member is arranged,
the arrangement surface area includes a first surface area at least at a part that does not correspond to the formation area of the circuit board and a second surface area, and
the first surface area has a surface roughness greater than that of the second surface area.

6. The electronic device according to claim 1, wherein
an inner surface of the housing has an arrangement surface area corresponding to an area where the heat conduction member is arranged,
the arrangement surface area includes a third surface area at least at a part that does not correspond to the through hole and the formation area of the circuit board and a fourth surface area, and the third surface area has a surface roughness greater than that of the fourth surface area.

7. The electronic device according to claim 1, wherein the through hole has a first dimension in the arrangement direction of the first and second electronic components and a second dimension in a direction perpendicular to the first direction in a planar direction of the circuit board, and the second dimension is greater than the first dimension.

\* \* \* \* \*